(12) United States Patent
Ellis-Monaghan et al.

(10) Patent No.: US 7,719,590 B2
(45) Date of Patent: May 18, 2010

(54) HIGH DYNAMIC RANGE IMAGING CELL WITH ELECTRONIC SHUTTER EXTENSIONS

(75) Inventors: John J. Ellis-Monaghan, Grand Isle, VT (US); Alain Loiseau, Williston, VT (US); Kirk D. Peterson, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 535 days.

(21) Appl. No.: 11/687,245

(22) Filed: Mar. 16, 2007

(65) Prior Publication Data

US 2008/0224186 A1    Sep. 18, 2008

(51) Int. Cl.
*H04N 5/232* (2006.01)
(52) U.S. Cl. ............... 348/308; 348/296; 250/208.1; 257/290; 257/291; 257/292
(58) Field of Classification Search ......... 348/306–310, 348/296, 241; 257/223, 290–292; 250/208.1
See application file for complete search history.

(56) References Cited

U.S. PATENT DOCUMENTS

| | | | |
|---|---|---|---|
| 6,204,524 B1 | 3/2001 | Rhodes | |
| 6,429,470 B1 | 8/2002 | Rhodes | |
| 6,780,666 B1 | 8/2004 | McClure | |
| 6,852,591 B2 | 2/2005 | Rhodes | |
| 6,888,122 B2 | 5/2005 | Fossum | |
| 6,975,356 B1 * | 12/2005 | Miyamoto | 348/308 |
| 7,224,389 B2 * | 5/2007 | Dierickx | 348/308 |
| 2005/0012168 A1 | 1/2005 | Hong | |
| 2005/0110884 A1 | 5/2005 | Altice, Jr. et al. | |
| 2006/0146159 A1 * | 7/2006 | Farrier | |

OTHER PUBLICATIONS

Akahane, et al., "A Sensitivity and Linearity Improvement of a 100 db Dynamic Range CMOS Image Sensor Using a Lateral Overflow Integration Capacitor", IEEE 2005 Symposium on VLSI Circuits Digest of Technical Papers, 2005, pp. 62-65.

* cited by examiner

*Primary Examiner*—Jason Chan
*Assistant Examiner*—Yih-Sien Kao
(74) *Attorney, Agent, or Firm*—Scully, Scott, Murphy & Presser, P.C.; Anthony J. Canale

(57) ABSTRACT

A pixel sensor cell of improved dynamic range comprises a coupling transistor that couples a capacitor device to a photosensing region (e.g., photodiode) of the pixel cell, the photodiode being coupled to a transfer gate and one terminal of the coupling transistor. In operation, the additional capacitance is coupled to the pixel cell photodiode when the voltage on the photodiode is drawn down to the substrate potential. Thus, the added capacitance is only connected to the imager cell when the cell is nearing its charge capacity. Otherwise, the cell has a low capacitance and low leakage. In an additional embodiment, a terminal of the capacitor is coupled to a "pulsed" supply voltage signal that enables substantially full depletion of stored charge from the capacitor to the photosensing region during a read out operation of the pixel sensor cell. In various embodiments, the locations of the added capacitance and photodiode may be interchanged with respect to the coupling transistor. In addition, the added capacitor of the pixel sensor cell allows for a global shutter operation.

16 Claims, 2 Drawing Sheets

HIGH DYNAMIC RANGE IMAGING CELL WITH ELECTRONIC SHUTTER EXTENSIONS

FIELD OF THE INVENTION

The present invention relates generally to pixel image sensors, in general, and particularly, an improved image cell having improved dynamic range by use of large capacitance when the cell approaches its charge capacity.

DESCRIPTION OF THE PRIOR ART

The requirements for current solid-state image sensors, e.g., CMOS image sensors, are that they be highly sensitive, have a high S/N ratio and a high resolution. However it is desirous to provide pixel image sensor devices with greater dynamic range. Current devices are currently limited in total dynamic range. At the low end devices can not collect less than 1 electron. At the high end, devices are limited to collect up to 30,000 electrons (i.e., approximately 5 fC calculated as 2 fF*2.5V where 2.5 volts is the bias of the sensing photodiode or photosensing device, fF is femptoFarads is the capacitance of the cell and C is coulombs (charge)).

Dynamic range could may increased by utilizing a higher bias voltage, but doing so may negatively impact power and junction leakage. Utilizing a higher capacitance may also increase dynamic range, however this is likely to increase dark current due to higher doping levels and an increase in tunnel current (See for example, the reference to S. M. Sze "Physics of Semiconductor Devices $2^{nd}$ edition p. 529).

Current attempts at extending the dynamic range of CMOS image sensors include the provision of an image sensor having a lateral overflow capacitor in a pixel, which integrates the overflowed charges from a fully depleted photodiode during the same exposure, as was described in the reference to Nana Akahane, et al. entitled "A Sensitivity and Linearity Improvement of a 100 dB Dynamic Range CMOS Image Sensor Using a Lateral Overflow Integration Capacitor", 2005 Symposium on VLSI Circuits Digest of Technical Papers, 4-900784-01-X, pp. 62-65.

FIG. 1 depicts a prior art circuit topology 10 as described in the VLSI Circuits reference by Akahane et al. As shown in FIG. 1, the prior art pixel circuit 10 includes a fully depleted photodiode device (PD), a floating diffusion to convert the charge to the voltage (FD), a charge transfer switch (M1), an overflow photoelectron integration capacitor (CS), a switch between the floating diffusion FD and the overflow capacitor CS (M3), a reset switch (M2), a source follower amplifier (M4) and a pixel select switch (M5). In operation, the pixel cell circuit topology 10 in FIG. 1 collects charge in the photodiode, lets charge overflow through the transfer switch M1 and M3 into the extra capacitor CS for extended dynamic range. The dynamic range in this embodiment reaches 100 dB while keeping a high sensitivity and a high S/N ratio in low and very bright lights.

Additional prior art circuit topologies may be found in references U.S. Pat. Nos. 6,204,524, 6,429,470, and 6,852,591 representative of pixel image cell topologies that extend dynamic range by adding a capacitor directly onto the photodiode without any intervening transistor device.

A further circuit design as described in U.S. Patent Application Serial No. 2005/0110884, shows a capacitor device linked to the transfer gate and provides a storage node for a pixel, allowing for kTC noise reduction prior to readout. The pixel may be operated with the shutter gate on during the integration period to increase the amount of time for charge storage by a pixel.

It would be desirable to provide a pixel circuit that exhibits improved dynamic range by including a capacitor device that is controllably coupled to the photosensitive charge accumulator element (e.g., photodiode).

Moreover, as global shutter operation is the next major feature to be added to CMOS imagers, it would be desirable to provide a pixel circuit that exhibits improved dynamic range by including a capacitor device controllably coupled to the photosensitive charge accumulator element and that additionally includes global shutter extensions which are not addressed in prior art circuit topologies.

SUMMARY OF THE INVENTION

According to the present invention, there is provided a pixel image device having improved extended dynamic range, particularly, by enabling adaptive coupling of a large capacitance via a coupling transistor to the pixel cell when the voltage on the photodiode is drawn down to the substrate potential. Thus, in this manner, the added capacitance is only connected to the imager cell when the cell is nearing its charge capacity. Otherwise, the cell has a low capacitance and low leakage.

Thus, according to one embodiment of the invention, there is provided a pixel image cell that relies upon the sub-threshold leakage characteristics of a transistor to enable charge carrier leakage into an added capacitor when the voltage on the photodiode is drawn down to the substrate potential. This sub-threshold leakage then continues to fill up the capacitor with its significantly larger (e.g., 2 fF-100 fF) capacitance allowing a 2-50× dynamic range increase.

Further, there is provided a pixel image cell that exhibits improved dynamic range that relies upon the sub-threshold leakage characteristics of a coupling transistor to leak additional accumulated charge into an added capacitor when the voltage on the photodiode is drawn down to the substrate potential and, that further is equipped with global shutter extensions.

Besides providing a pixel cell imager topology having improved dynamic range advantage, it additionally offers the ability to use true correlated double sampling with both photodiode read and the capacitor read operations.

According to one aspect of the invention, there is provided a pixel sensor cell and method of operation. The pixel sensor cell comprises:

a photosensitive element for receiving incident light for a pixel;

a capacitor device for storing charge, the capacitor having first and second terminals;

a capacitor coupling transistor device including a first terminal connected to the first terminal of the capacitor device and a second terminal connected to the photosensitive element; wherein the capacitor coupling transistor device is biased so as to enable additional charge carriers to leak to the capacitor device via the capacitor coupling transistor device when a sufficient number of charge carriers have accumulated at the photosensitive element thereby extending the sensor cell's dynamic range of operation.

Moreover, further to this embodiment, the capacitor device is enabled for global shutter operation, whereby the charge carriers at the photosensitive element is fully depleted into the capacitor during a period of shutter operation.

In still a further embodiment, a voltage supply is provided for supplying a voltage Vp to the second terminal of the capacitor device, the voltage Vp biasing the capacitor device to facilitate charges being leaked thereto via the capacitor coupling transistor device.

According to another aspect of the invention, there is provided a pixel sensor cell and method of operating a pixel sensor cell of increased dynamic range, the sensor cell having a photosensitive element for receiving incident light for the pixel. The method comprises:

providing a capacitor device for storing charge, the capacitor having first and second terminals;

providing a capacitor coupling transistor device including a first terminal connected to the first terminal of the capacitor device and a second terminal connected to the photosensitive element; and, biasing the capacitor coupling transistor device so as to enable additional charge carriers to leak to the capacitor device via the capacitor coupling transistor device when a sufficient number of charge carriers have accumulated at the photosensitive element, thereby increasing the sensor cell's dynamic range of operation.

Further to this aspect of the invention, there is provided the additional step of biasing the second terminal of the capacitor device with a voltage to facilitate leaking of charges via the capacitor coupling transistor device.

Advantageously, the invention is advantageously employed in integrated circuits and electronic devices that employ arrays of pixel imager cells of 3T and 4T and extended designs, using CMOS semiconductor manufacturing technology.

BRIEF DESCRIPTION OF THE DRAWINGS

The objects, features and advantages of the present invention will become apparent to one skilled in the art, in view of the following detailed description taken in combination with the attached drawings, in which.

DESCRIPTION OF THE PREFERRED EMBODIMENTS

According to the invention, a new pixel image device is provided that extends dynamic range above and beyond those of conventional image cell devices.

Figure 1:
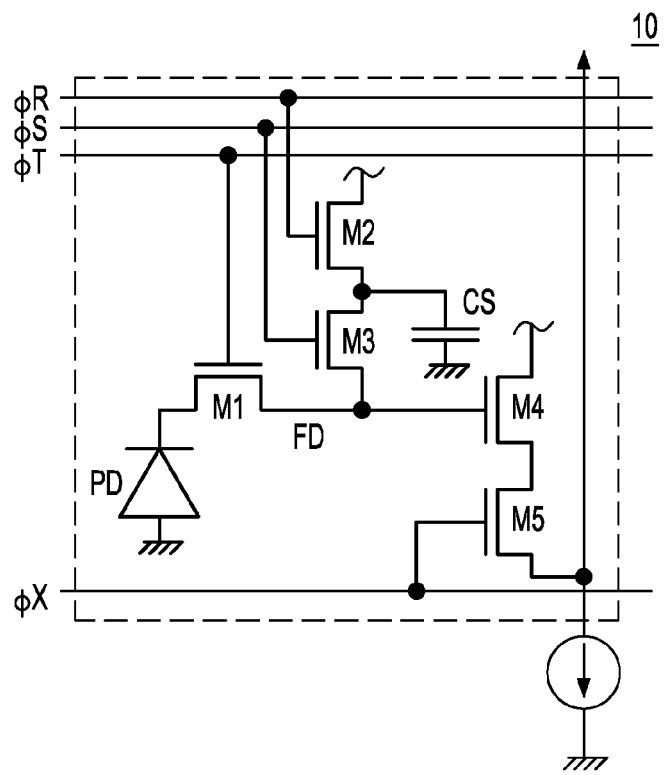
FIG. 1 depicts an example pixel image cell circuit 10 according to the prior art.
Figure 2:
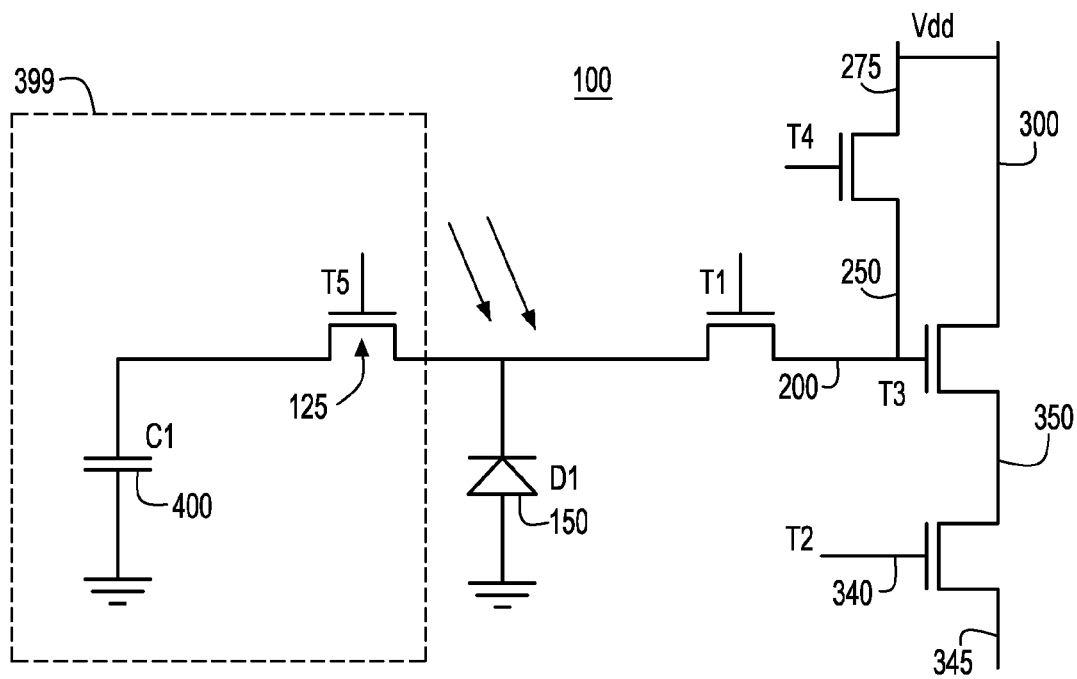
FIG. 2 depicts the novel pixel cell 100 of the invention that has increased dynamic range.

FIG. 2 depicts the novel pixel cell 100 of the invention that has increased dynamic range as compared to conventional pixel cells. As shown in the circuit of FIG. 2, there is depicted the four (4) device pixel design 100 typically referred to in literature as a 4 device active pixel sensor (APS). The pixel device 100 consists of a first transfer device labeled T1 with a transfer gate, whose one diffusion is the photo diode 150 which collects the incident light, and the other diffusion of the transfer device T1 is referred to as the floating diffusion 200. The floating diffusion 200 is connected to the source 250 of a Reset device T4 having a reset gate, and the drain 275 of the reset device T4 is connected to Vdd which also serves as the reset voltage. Note that sometimes the drain of the reset device is connected to a separate reference voltage Vref, different from Vdd, and serves as the reset voltage. The voltage of the reset gate of device T4 is commonly 4V and it should be at least one threshold voltage higher than the desired reset voltage. The source 200 of the transfer device T1 is additionally connected to the gate of N-channel MOS readout transistor T3. The drain 300 of the readout device T3 is connected to Vdd and the source 350 of the NFET readout device T3 is connected to the drain of N-channel MOS transistor row select device T2, whose gate is connected to a Row Select line 340. The source of the row select NFET T2 is connected to a column output line 345.

Further to the embodiment of the invention depicted in FIG. 2, there is provided the additional circuit addition 399 including a large capacitor device C1 400 connected to the cell via a further transistor device T5. Particularly, a first terminal of the capacitor C1 is connected to the source or drain diffusion of the coupling transistor T5. In operation, when the cell 100 is nearing its charge capacity the large capacitor C1 is switched in circuit; otherwise, the cell 100 has a low capacitance and low leakage. While each of the transistors depicted in FIG. 2 are nFET (nMOSFET) devices, it is understood that one or more pFET devices may be incorporated in the same circuit with the polarities of all voltages, e.g., Vdd, modified accordingly.

The operation of the pixel arrangement shown in FIG. 2 is as follows: during a Reset operation, both the transfer transistor device T1 and the reset transistor device T4 are high, the reset voltage is transferred to the photo diffusion 200. The capacitor coupling T5 device is additionally turned on. As a result of turning on devices T1, T4 and T5, the voltage across D1 is pinning voltage and the voltage across C1 is equal to the pinning voltage.

During photo accumulation, with incident light on the photo diffusion, there is a charge integration period formed by the resulting photocurrent generated by the charge formation at the photo diode D1 which decreases the voltage across the diode. The following circuit configuration is established for photo accumulation: Reset transistor device T4 and transfer device T1 are turned OFF and device T5 is set to a bias voltage, e.g., applied to the gate 125 of device T5. For example, T5 may be set to about gnd to 0.5V above gnd., or a value sufficient to allow the transistor to leak current to C1 when sufficient carriers have been accumulated on the photodiode. An amount of photocarriers that may initiate the leakage may be on the order of 10 k $\bar{e}$, for example. The bias may comprise a ground potential but other bias voltage points for gate bias 125 of transistor T5 may be implemented. Thus, in FIG. 2, it is seen that the cell 100 relies upon the sub-threshold leakage characteristics of transistor T5 to leak excess carriers into the capacitor C1 when the voltage on the photodiode is drawn down close to the substrate potential, i.e., Vgs of T5 starts to approach Vt (Vg=potential on T5, and Vs=potential on D1 so Vgs=vg(t5)−vs(d1) which is adjustable by the gate potential applied to T5. This sub-threshold leakage will then continue to fill up the capacitor with its significantly larger (about 2 fF-100 fF) capacitance allowing about a 2-50× dynamic range increase. Capacitor C1 may comprise a capacitance value that is identical to the capacity of the photodiode anywhere from 2 femptofarads at the low end to 100 femptofarads at the high end. The capacitor devices may be formed using standard CMOS semiconductor manufacturing techniques and may comprise a trench capacitor, a MIMcap, and the like. It may for some applications be advantageous to use a pinned photodiode or pinned photogate as well.

The next operation is a read operation which comprise a multi-step process: 1) during read, the transfer device T1, reset device T4 and capacitor coupling device T5 are each turned OFF. The row select transistor device T2 is turned ON so as to enable measurement of a null signal at the output line 345 for use in Correlated Double Sampling (CDS); 2.) then the reset transistor T4 is turned on bringing the potential at node 200 (floating diffusion node) to a potential below Vdd. (This potential is determined by both the Gate potential of the transistor T4 and the Vt of transistor T4.); 3.) The reset transistor is then turned off. (which may will couple node 200 down (a couple of tenths of a volt.)); 4.) Then, the potential on node 200 is read through the readout circuitry through transistors T3 and T2 to the column circuits and this potential is stored on a capacitor or like charge storage device; 5) then, during a second part of the read operation, reset device T4 and coupling device T5 remain OFF and then transfer device T1 is turned on along with row select transistor device T2. At this point charge at the floating diffusion on transistor T3 is measured, i.e., read the voltage at the source of T3 commensurate with the voltage accumulated at the gate of T3 representing the charge accumulation at the photodiode D1. This result is stored on a second capacitor or like charge storage device in the column circuit and the desired signal is the measured by subtracting the potentials on the two stored capacitors; 6) during a next step, the floating node, i.e., the source diffusion 200 at the Transfer device T1 is reset again by turning ON transfer device T1 and Reset device T4. During this step, coupling device T5 remains OFF; 7) then, in a final read step, the charge that had been collecting on C1 400 is read by turning each of coupling device T5, transfer device T1 and row select device T2 ON and measuring the charge on the capacitor C1 400 using the readout transistor device T3, i.e., read the voltage at the source of T3 commensurate with the voltage accumulated at the gate of T3 representing the excess charge accumulation at the capacitor C1.

Optionally, the read of the capacitor may proceed like the reading of the photodiode with a reset operation, storage of the results on the column capacitor or like charge storage means, transfer the signals using T5 and T1 and proceed to read the results on a second column capacitor or like charge storage means, and then subtract the two for the final measurement. This may or may not be performed when excess charges are stored on the overflow capacitor C1 as there is usually less need to worry about the smaller read and reset noises that are being cancelled out by using the CDS technique.

In an alternate embodiment of the invention, the pixel sensor circuit 100 of FIG. 2 may be configured for alternate use, particularly, the timing may be modified for electronic shutter use whereby the integration time (photodiode exposure) time of the photodiode is controlled and all pixels are simultaneously exposed and stored in parallel. As conventionally known, the shutter feature may be activated by a mechanical shutter that stops or gates the accumulation of charge at the photodiode. In this embodiment, the circuit of FIG. 2 is programmed for operation as follows: As in the first embodiment of FIG. 2, the same reset operation is performed whereby both the transfer transistor device T1 and the reset transistor device T4 are high (i.e., ON), the reset voltage is transferred to the photo diffusion 200. The capacitor coupling device T5 is additionally turned ON. As a result of turning on devices T1, T4 and T5, the voltage across D1 is pinning voltage and the voltage across C1 is equal to the pinning voltage. Then, in a further step, transistor devices T4 and T1 are turned OFF, when the electronic shutter is commenced. During this period of shutter operation, charge is accumulated on D1 and C1 while T5 remains ON. Then, coupling device T5 is turned OFF when the electronic shutter is to be turned off. Thus, storing the potential of the photodiode and capacitor on the capacitor C1. Any further charges accumulated in the photodiode will not influence the potentials on C1. To read the pixel value, the photodiode device D1 is first reset by keeping T5 turned OFF while transistors T1 and T4 are ON. The null value is then read on the floating diffusion (CDS operation) by turning off T1 and T4 and turning on T2. Then, the charge on the capacitor device C1 is read by turning ON each of transistors T5, T1 and T2 while keeping transistor device T4 OFF.

Figure 3:
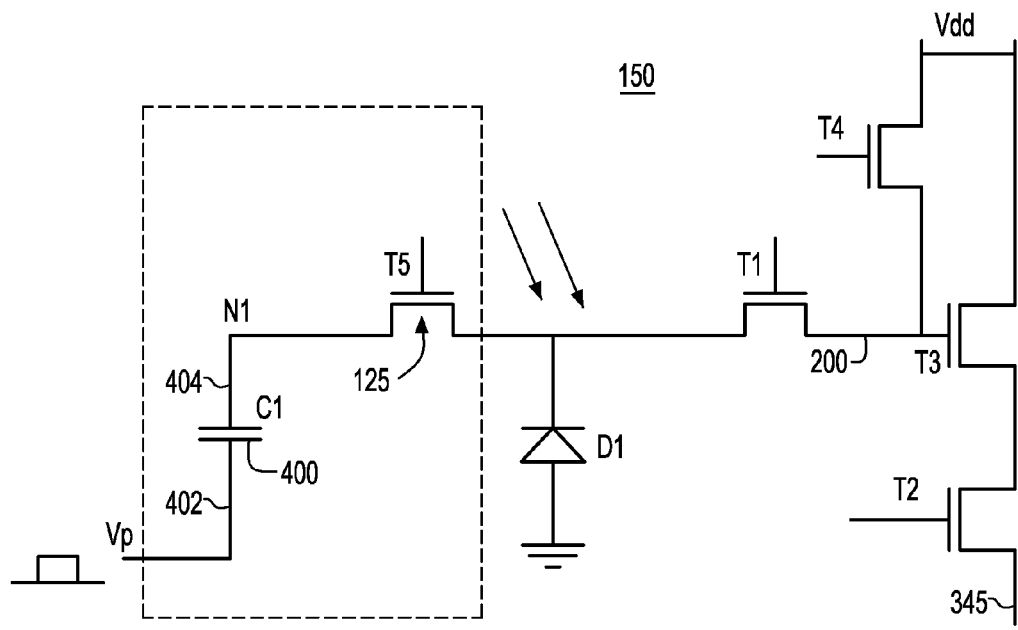
FIG. 3 depicts an alternate embodiment 150 of the novel pixel cell 100 of the invention described with respect to FIG. 2 that exhibits increased dynamic range according to the invention by implementing a pulsed voltage to bias capacitor C1; and, FIG. 4 depicts an alternate embodiment 150' of the novel pixel cell 150 of the invention depicted in FIG. 3 wherein the locations of the capacitor and photodiode are interchanged.

FIG. 3 depicts a modification of the novel pixel cell 100 of the invention that has increased dynamic range as compared to conventional pixel cells. Particularly, the circuit 150 of FIG. 3, is identical to the circuit modified for electronic shutter use with the difference being that it is configured for pulsed mode of operation. That is, in the circuit 150 of FIG. 3, a pulsed voltage power supply providing pulsed signal Vp is provided at one terminal 402 of the capacitor C1 for altering the voltage potential of the C1 in order to obtain all charge out of D1. Thus, during a power reset operation, the value of Vp at terminal 402 is low, e.g., at ground potential, and the voltage across D1 and C1 equals the pinning potential. Then, during photo accumulation in the embodiment of the circuit 150 in FIG. 3, the reset device T4 and transfer device T1 are turned OFF, while the gate 125 of T5 is set to a bias that allows the transistor to leak current to C1 when sufficient carriers have been accumulated on the photodiode. It is understood that the gate bias may be ground but other bias points are possible. Then, the voltage Vp at terminal 402 is stepped up, i.e., raised to a higher value greater than ground in a range of 0.5 v to 3.3 v, which in operation, raises the potential voltage at the node N1 at the other terminal 404 of the capacitor C1 making it easier for charges to leak across T5 onto T1, i.e., enables more charge out of D1 to be accumulated.

To read the pixel value after charge accumulation in the circuit 150 of FIG. 3, a read operation is performed which comprises a multi-step process: 1) during read, the transfer device T1, reset device T4 and capacitor coupling device T5 are each turned OFF while the voltage Vp is high. The row select transistor device T2 is turned ON so as to enable measurement of a null signal at the output line 345 for use in correlated double sampling; 2) then, during a second part of the read operation, reset device T4 and coupling device T5 remain OFF and then transfer device T1 is turned on along with row select transistor device T2. Charge is transferred from the photodiode to the floating diffusion. At this point, charge at the floating diffusion on transistor T3 is measured, i.e., read the voltage at the source of T3 commensurate with the voltage accumulated at the gate of T3 representing the charge accumulation at the photodiode D1; 3) during a next step, the floating node, i.e., the source diffusion 200 at the Transfer device T1 is reset again by turning ON transfer device T1 and Reset device T4. During this step, coupling device T5 remains OFF; Optionally, the reset value may be read again using T3. 4) then, in a final read step, the charge that had been collecting on C1 400 is read by turning each of coupling device T5, transfer device T1 and row select device T2 ON while the voltage Vp is brought low, measuring the charge on the capacitor C1 400 using the readout transistor device T3, i.e., read the voltage at the source of T3 commensurate with the voltage accumulated at the gate of T3 representing the excess charge accumulation at the capacitor C1.

For this application, a pinned photodiode or a pinned photogate may be ideal for capacitor C1 to avoid introducing excess noise from the Vp signal.

The circuit 150 of FIG. 3 may be additionally modified for electronic shutter use by configuring it for pulsed mode of operation. That is, in the circuit 150 of FIG. 3, the reset operation is as described herein; then the reset device T4 and transfer device T1 are turned OFF when the shutter starts. At this point, charge begins accumulating on D1 and C1 by turning ON coupling transistor T5 while the value of Vp at the capacitor terminal 402 is low, e.g., ground. Then, after photo accumulation in the alternate embodiment of operating the circuit 150 in FIG. 3 designed for use with electronic shutter, the voltage Vp at terminal 402 is stepped up, i.e., raised to a higher value greater than ground, which in operation, raises the potential voltage (ideally, above the pinning potential of the diode D1) at the node N1 at the other terminal 404 of the capacitor C1 making charges generated in D1 conduct across T5 and onto C1, leaving D1 fully depleted. Then, T5 is turned OFF when the electronic shutter is to be turned off. Then, to read the pixel value, the photodiode device D1 is first reset by keeping T5 turned OFF while transistors T1 and T4 are ON. Then, the charge on the capacitor device C1 is read by turning ON each of transistors T5, T1 and T2 while voltage value Vp is brought low keeping transistor device T4 OFF.

Figure 4:
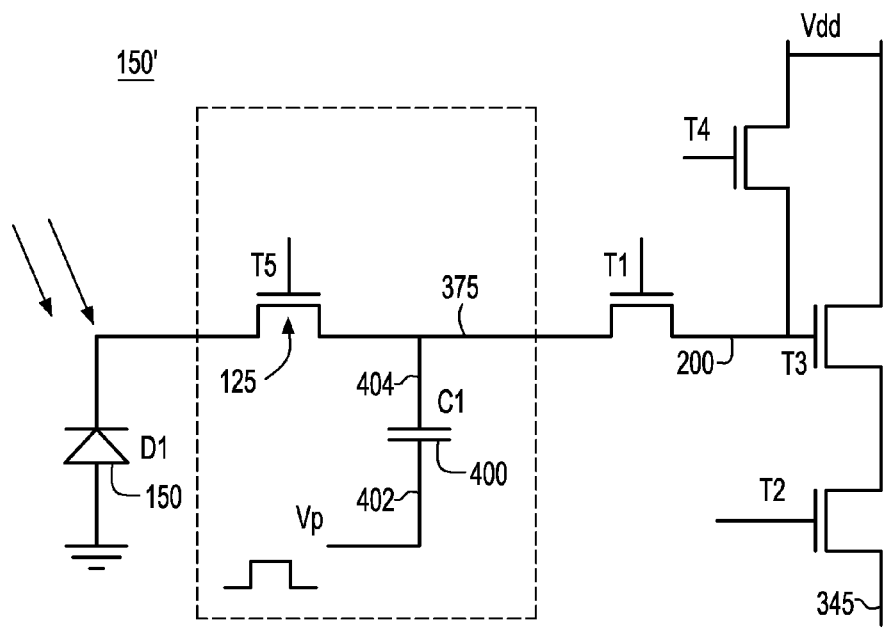

A further modification to the pixel cell structure 150 of FIG. 3 is depicted in FIG. 4 which shows a circuit 150' that has switched the positions of the capacitor and the diode. That is, in the circuit 150' of FIG. 4, the reset operation is achieved by turning on T1, T4 and T5 with Vp set to a low condition. Then, the reset device T4 and transfer device T1 are turned OFF, while device T5 is turned ON when the shutter starts. At this point, charge begins accumulating on D1 and C1 by turning ON coupling transistor T5 while the value of Vp at the capacitor terminal 402 is low, e.g., ground. Then, after photo accumulation in the alternate embodiment of operating the circuit 150' in FIG. 4 designed for use with electronic shutter, the voltage Vp at terminal 402 is stepped up, i.e., raised to a higher value greater than ground, which in operation, raises the potential voltage (preferably above the pinning potential of diode D1) at the other terminal 404 of the capacitor C1 driving all the charges to conduct from D1 through T5 to C1. Then, T5 is turned OFF when the electronic shutter is to be turned off. Then, to read the pixel value, i.e., read the charge at C1, the operations performed as follows: 1) the floating diffusion node 200 is reset by turning on T4 (while T1 and T5 are off); 2) then, the reset device T4 is turned OFF. The row select transistor device T2 is turned ON so as to enable measurement of a null signal at the output line 345 for use in correlated double sampling; 3) then, during a second part of the read operation, reset device T4 and coupling device T5 remain OFF and then transfer device T1 is turned on and then off again and row select transistor device T2 is ON. At this point charge at the floating diffusion on transistor T3 is measured. This completes a shuttered read. For this application as well, a pinned photodiode or a pinned photogate may be ideal for capacitor C1 to avoid introducing excess noise from the Vp signal.

Further, with respect to application of the global shutter option, it may be preferable that D1 have a low pin potential. This will enable all charges to transfer onto capacitor C1 while the coupling device gate of T5 is turned ON although these charges will be collected by D1. In an optional embodiment, a blooming path may be includes such that the charge accumulated on D1 will bloom to another location (not capacitor C1) during the remainder of the exposure.

It is further understood that, for global (electronic) shutter application to work in the embodiments of FIGS. 3 and 4, the capacitor C1 400 needs to be insensitive to light exposure. That is, by implementing a light shield or providing a metal cap layer, the capacitor structure may be rendered insensitive to light exposure.

It is further understood that the embodiments of the invention as depicted in FIGS. 2-4 may be devised for pixel cell configuration that are considered alternate extensions to the 4T cells depicted, e.g., they could equally apply to switched rail 3T, 4T and shared structures (4T4S, 3T4S, etc.).

The invention has been described herein with reference to particular exemplary embodiments. Certain alterations and modifications may be apparent to those skilled in the art, without departing from the scope of the invention. The exemplary embodiments are meant to be illustrative, not limiting of the scope of the invention.

The invention claimed is:

1. A pixel sensor cell comprising:
    a photosensitive element for receiving incident light for a pixel;
    a capacitor device for storing charge, sad capacitor having first and second terminals;
    a capacitor coupling transistor device including a first terminal connected to said first terminal of said capacitor device and a second terminal connected to said photosensitive element, said capacitor coupling transistor device is biased so as to enable additional charge carriers to leak to said capacitor device via said capacitor coupling transistor device when a sufficient number of charge carriers have accumulated at said photosensitive element thereby extending a dynamic range of operation of said sensor cell; said cell further comprising:
    a transfer transistor device including a first terminal connected to said photosensitive element and enabled for transferring accumulated charge carriers from said photosensitive element and said capacitor device to a formed diffusion region for output thereof.

2. The pixel sensor cell as claimed in claim 1, wherein said photosensitive element is a photodiode.

3. The pixel sensor cell as claimed in claim 1, wherein a voltage across said photosensitive element drops as charge accumulates at said element, said capacitor coupling transistor device being enabled to leak said additional charge carriers when voltage across said photosensitive element becomes sufficiently low.

4. The pixel sensor cell as claimed in claim 3, wherein said capacitor device enables for global shutter operation, whereby the charges accumulated at said photosensitive element are fully depleted onto the capacitor after a period of shutter operation.

5. The pixel sensor cell as claimed in claim 3, further comprising:
    a voltage supply for providing a voltage Vp to said second terminal of said capacitor device, said voltage Vp biasing said capacitor device to facilitate charges being transferred via said capacitor coupling transistor device.

6. The pixel sensor cell as claimed in claim 3, wherein said second terminal of said capacitor coupling transistor device is connected to said first terminal of said capacitor device and a first terminal of said capacitor coupling transistor device is connected to said photosensitive element.

7. The pixel sensor cell as claimed in claim 1, further comprising means for performing a pixel read operation, said read operation comprising a double sampling operation whereby a charge accumulated at said photosensitive element is first read, and then a charge at said capacitor device is read at said formed diffusion region.

8. A pixel sensor cell comprising:
a photosensitive element for receiving incident light for a pixel;
a capacitor device for storing charge, said capacitor having first and second terminals;
a capacitor coupling transistor device including a first terminal connected to said first terminal of said capacitor device and a second terminal connected to said photosensitive element, said capacitor coupling transistor device being biased so as to enable additional charge carriers to leak to said capacitor device via said capacitor coupling transistor device when a sufficient number of charge carriers have accumulated at said photosensitive element, thereby increasing a dynamic range of operation of said sensor cell; and,
a voltage supply for providing a voltage Vp to said second terminal of said capacitor device, said voltage Vp biasing said capacitor device to facilitate charges being transferred via said capacitor coupling transistor device, said cell further comprising:
a transfer transistor device including a first terminal connected to said photosensitive element and enabled for transferring accumulated charge carriers from said photosensitive element and said capacitor device to a formed diffusion region for output thereof.

9. The pixel sensor cell as claimed in claim 8, wherein a voltage across said photosensitive element drops as charge accumulates at said element, said capacitor coupling transistor device being enabled to transfer said additional charge carriers when voltage across said transistor device becomes sufficiently large.

10. The pixel sensor cell as claimed in claim 8, wherein said capacitor device enables for global shutter operation, whereby said photosensitive element is fully depleted onto the capacitor after a period of shutter operation.

11. The pixel sensor cell as claimed in claim 8, wherein said second terminal of said capacitor coupling transistor device is connected to said first of said capacitor device and a first terminal of said capacitor coupling transistor device is connected to said photosensitive element.

12. The pixel sensor cell as claimed in claim 8, further comprising means for performing a pixel read operation, said read operation comprising a double sampling operation whereby a charge accumulated at said photosensitive element is first read, and then a charge at said capacitor device is read at said formed diffusion region.

13. A method of operating a pixel sensor cell of increased dynamic range, said sensor cell having a photosensitive element for receiving incident light for the pixel, said method comprising:
providing a capacitor device for storing charge, said capacitor having first and second terminals;
providing a capacitor coupling transistor device including a first terminal connected to said first terminal of said capacitor device and a second terminal connected to said photosensitive element;
biasing said capacitor coupling transistor device so as to enable additional charge carriers to leak to said capacitor device via said capacitor coupling transistor device when a sufficient number of charge carriers have accumulated at said photosensitive element, thereby increasing a dynamic range of operation of said sensor cell;
transferring accumulated charge carriers from said photosensitive element and said capacitor device to a formed diffusion region for output thereof, said method further comprising:
performing a pixel read operation, said read operation comprising a double sampling operation of voltage formed at said formed diffusion region by first reading a charge accumulated at said photodiode, and then reading a charge at said capacitor device.

14. The method as claimed in claim 13, wherein said capacitor device enables for global shutter operation, said photodiode being fully depleted into the capacitor during a period of shutter operation.

15. The method as claimed in claim 13, further comprising:
biasing said second terminal of said capacitor device with a voltage to facilitate leaking of charges via said capacitor coupling transistor device.

16. A method of operating a pixel sensor cell of increased dynamic range, said sensor cell having a photosensitive element for receiving incident light for the pixel, said method comprising:
providing a capacitor device for storing charge, said capacitor having first and second terminals;
providing a capacitor coupling transistor device including a first terminal connected to said first terminal of said capacitor device and a second terminal connected to said photosensitive element;
biasing said capacitor coupling transistor device so as to enable additional charge carriers to leak to said capacitor device via said capacitor coupling transistor device when a sufficient number of charge carriers have accumulated at said photosensitive element, while biasing said second terminal of said capacitor device with a voltage to facilitate leaking of charges via said capacitor coupling transistor device;
transferring accumulated charge carriers from said photosensitive element and said capacitor device to a formed diffusion region for output thereof; and
performing a pixel read operation, said read operation comprising a double sampling operation of voltage formed at said formed diffusion region by first reading a charge accumulated at said photodiode, and then reading a charge at said capacitor device thereby increasing a dynamic range of operation of said sensor cell.

* * * * *